United States Patent [19]

Jüngst et al.

[11] 4,093,817

[45] June 6, 1978

[54] SUPERCONDUCTOR

[75] Inventors: Klaus-Peter Jüngst; Günter Ries, both of Karlsruhe, Germany

[73] Assignee: Gesellschaft fur Kernforschung m.b.H., Karlsruhe, Germany

[21] Appl. No.: 679,879

[22] Filed: Apr. 23, 1976

[30] Foreign Application Priority Data

Apr. 23, 1975 Germany ............................ 2517924

[51] Int. Cl.[2] ............................................ H01B 12/00

[52] U.S. Cl. .................................. 174/32; 174/126 S

[58] Field of Search ............... 174/15 S, 126 S, 128 S, 174/128 R, 32, 34, 130

[56] References Cited

U.S. PATENT DOCUMENTS 3,646,249 2/1972 Maisson-Franckhauser .... 174/126 S 3,662,093 5/1972 Wilson et al. .................... 174/128 S 3,835,242 9/1974 Critchlow et al. ............... 174/126 S

*Primary Examiner*—Arthur T. Grimley

*Attorney, Agent, or Firm*—Spencer & Kaye

[57] ABSTRACT

A superconductor having a plurality of superconducting filaments embedded in a solid conductor of normal conducting material, and with each of the filaments being twisted about the longitudinal axis of the superconductor to form a helix which is concentric with respect to the longitudinal axis, in order to suppress coupling effects occurring between filaments on circles with different radii in time variable magnetic fields. Each of the filaments is twisted about the conductor axis to provide alternating equal length sections along the conductor axis with opposite senses of rotation of the filaments about the conductor.

3 Claims, 3 Drawing Figures

SUPERCONDUCTOR

BACKGROUND OF THE INVENTION

The present invention relates to a superconductor made of a plurality of superconductive filaments which are embedded in normal conducting material. More particularly, the present invention relates to such a superconductor wherein the filaments are arranged concentrically in the cross section of the superconductor and are twisted about the longitudinal axis of the conductor, each filament forming a helix which is concentric with the longitudinal axis. The result of this arrangement of the filaments is the suppression of coupling effects between the filaments in circles of different radii, which are produced as a result of time varying magnetic fields.

Superconductors of this type, i.e., of the multifilament wire type, are required with increasing frequency to produce coils for multipole magnets, e.g., for particle accelerators in high energy physics and for coil arrangements for the enclosure of plasma in fusion experiments.

These superconductors operated in pulsed magnetic fields of a high intensity, with a field component having a transverse orientation, i.e., perpendicular to the longitudinal axis of the conductor, and a field component having a longitudinal orientation, i.e., parallel to the longitudinal axis of the conductor.

It is known (Journal of Applied Physics, Vol 40, pages 2080–2082, 1969) to employ multifilament wire type superconductors for conducting electrical current in time variable magnetic fields. These conductors consist of a plurality of filaments of superconducting material such as NbTi with a diameter of a few microns, which are embedded in a matrix of normally conducting material, such as copper, and form a multifilament wire.

The filament diameter is kept as small as possible (5 to 50μ) in order to substantially prevent premature changeover to normal conduction before reaching the critical current (magnetic stability) and reduce a.c. field losses.

In time variable magnetic fields which are oriented transversely to the conductor axis, the filaments are coupled by induction effects. Thus, above a predetermined rate of change of field, the superconductor will behave as if it were made of but a single superconductive core with all the attendant drawbacks with respect to magnetic stability and a.c. field losses. It is also known that, to overcome these drawbacks, the superconductor can be twisted about its longitudinal axis (Journal of Physics D 3, pages 1517–1531, 1970).

This twisting of the multifilament wire, which is of advantage for the case of time variable transverse magnetic fields, has the drawback that with the presence of time variable longitudinal magnetic field components, i.e., components which are oriented parallel to the conductor axis, new coupling effects will occur. Filaments arranged at two different radii within the conductor form coils having the same number of windings but different winding areas with respect to a longitudinal field component extending in the direction of the conductor axis. Therefore, a temporary change in the magnetic field produces voltage differences leading to coupling currents between these two coils which currents become greater with increasing conductor length and decreasing length between adjacent coil turns, i.e., increasing number of windings in the coils. Above a predetermined rate of change of field these coupling currents lead to shielding of the magnetic field and thus to magnetic instability and higher a.c. field losses.

SUMMARY OF THE INVENTION

It is the object of the present invention to provide a superconductor which is substantially free of the drawbacks of the known multifilament wires in time variable magnetic fields having a longitudinal field component, and which encounters only low losses.

This is accomplished, according to the present invention, by the novel arrangement of the filaments. As in prior art conductors the filaments are embedded in a matrix of normal conducting material at different radii within the cross section of the conductor and are twisted about the longitudinal axis of the conductor to form helices concentric with the longitudinal axis of the conductor. However, rather than being twisted in one sense of rotation only as in the prior art, according to the invention, the filaments are twisted first in one sense and then in another, opposite sense of rotation, alternately over equal sections of predetermined length. Preferably each of the helices formed by the filaments performs a predetermined number of complete revolutions about the longitudinal conductor axis in a length section of the conductor which corresponds to the alternating length sections.

The advantages of the present invention are, in particular, that the voltage induced in the coils formed of twisted filaments becomes zero after every two length sections of alternating sense of rotation and only slight difference voltages can occur between filament coils of different radii. The losses occurring in the magnetic fields with longitudinal field components are thus reduced substantially. Simultaneously, the advantages of twisting with respect to the presence of a transverse field component are maintained.

DETAILED DESCRIPTION OF THE PREFERRED EMBODIMENTS

Figure 1:
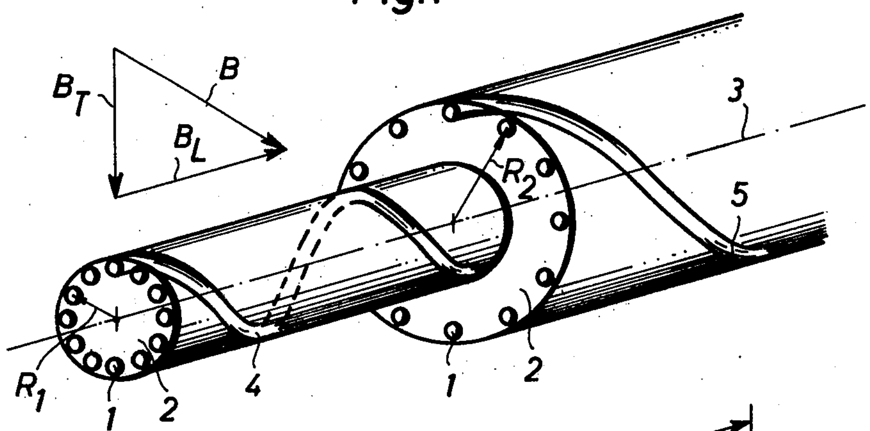
FIG. 1 is a simplified drawing showing a multifilament wire type superconductor with filaments which are twisted in a first sense of rotation according to the prior art.

FIG. 1 is a simplified representation of a multifilament wire type superconductor formed of a plurality of a superconducting filament 1, e.g. of NbTi, which are embedded in a normal conducting matrix 2, e.g. of copper. Alternatively, the normal conducting material may consist of copper and cupro-nickel with the cupro-nickel forming sheets around each filament. Filaments 1 are concentrically arranged on different radii, only two radii $R_1$, $R_2$, being shown, of the cross section of the conductor and are twisted about the conductor axis 3 of the multifilament wire to form helices 4 and 5 which are concentric about the longitudinal axis of the conductor. In FIG. 1 the twisting of the filaments to form the helices 4 and 5 is indicated for only one filament on each radius $R_1$ and $R_2$. However it is to be understood that all filaments of the conductor are similarly twisted. In a time variable magnetic field B with a transverse component $B_T$ perpendicular to the conductor axis 3, and a longitudinal component $B_L$ parallel to the conductor axis 3, coupling effects produced by the transverse component $B_T$ are substantially compensated by the twisting. However the coupling effects of the longitudinal field components $B_L$ are not compensated by forming the helices in this manner. For the component $B_L$ the twisted helical filaments simply form coils with the same number of windings at the different radii $R_1$ and $R_2$, respectively, i.e., different winding areas.

Figure 2:
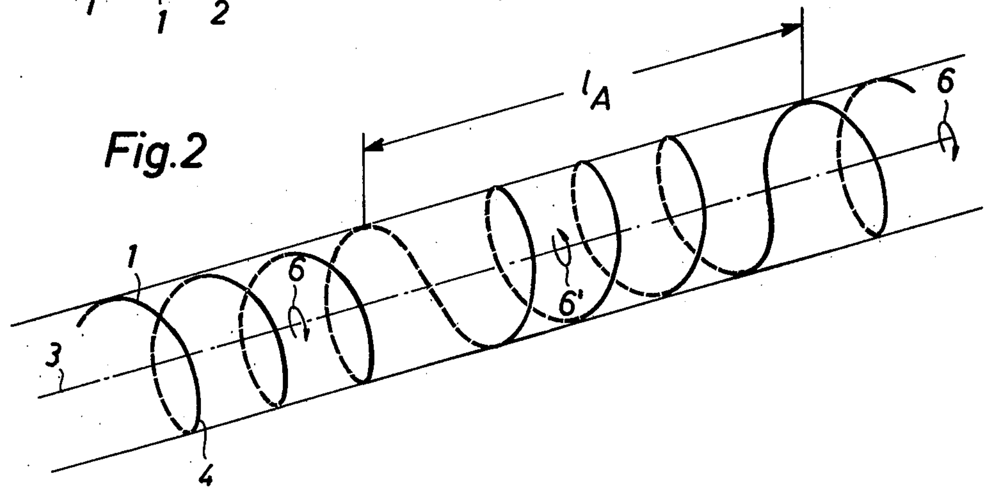
FIG. 2 shows a filament of a multifilament wire which is twisted alternatingly in a first sense of rotation and then in a second sense of rotation according to the invention.

The spatial configuration of a filament 1 with respect to the conductor axis 3 in an alternatingly twisted multifilament wire type superconductor according to the invention is shown in a simplified manner in FIG. 2.

As shown in FIG. 2, the sense of rotation of the twisting of the filaments 1 about the conductor axis 3 alternates between a first sense of rotation 6 and the opposite sense of rotation 6' after each longitudinal section of equal length $\mathbf{1}_A$ of the conductor. Preferably the helices of the filaments 1 in each section of length $\mathbf{1}_A$ of the conductor contain a predetermined number of complete revolutions about the conductor axis 3.

Figure 3:
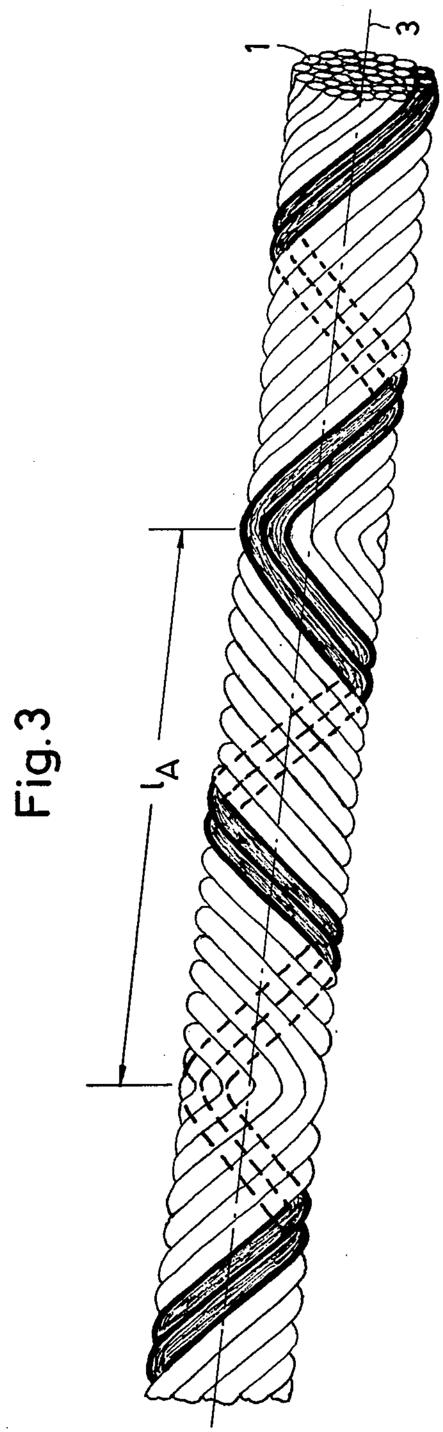
FIG. 3 shows a section of an alternatingly twisted filament bundle.

FIG. 3 shows the bundle of filaments 1 of a multifilament wire twisted about the axis 3 with two revolutions per longitudinal section $\mathbf{1}_A$. All of the filaments 1 are twisted with the same number of revolutions per same length $\mathbf{1}_A$. Two of the filaments 1 on the outer radius of the filament bundle are accentuated for clarity. A specific example of an embodiment of the invention has the following parameters:

-continued

| | |
|---|---|
| Wire diameter | 1.0 mm |
| outer diameter of the filament bundle | 0.9 mm |
| normal conducting material | Cu |
| superconducting material | NbTi |
| number of filaments | 1000 |
| filament diameter | 10 μm |
| length $1_A$ | 10 mm |
| number of revolutions per length $1_A$ | 2 |

It will be understood that the above description of the present invention is susceptible to various modifications, changes and adaptations, and the same are intended to be comprehended within the meaning and range of equivalents of the appended claims.

What is claimed is:

1. In a superconductor having a plurality of superconducting filaments embedded in a solid conductor of normal conducting material, said filaments being disposed on different radii within the cross section of said conductor, and each of said filaments being twisted about the longitudinal axis of said conductor and forming a helix which is concentric with respect to said longitudinal axis; the improvement wherein: each of said filaments is twisted in a first sense of rotation and then in a second sense of rotation in respective alternate sections of equal predetermined length, said second sense of rotation being opposite said first sense of rotation, whereby the coupling effects between filaments on circles of different radii produced by the components of time variable magnetic fields are suppressed.

2. A superconductor as defined in claim 1, wherein each of the helices formed by said filaments contains a predetermined number of complete revolutions in each of said alternate sections of equal predetermined length.

3. A solid conductor as claimed in claim 1 wherein the normal conducting material is copper, and said superconducting filaments are composed of NbTi.

* * * * *